(12) United States Patent
Richardson

(10) Patent No.: US 6,954,107 B2
(45) Date of Patent: Oct. 11, 2005

(54) DIFFERENTIAL CURRENT AMPLIFIER WITH COMMON MODE REJECTION AND HIGH FREQUENCY BOOST

(75) Inventor: Kenneth G. Richardson, Erie, CO (US)

(73) Assignee: LSI Logic Corporation, Milpitas, CA (US)

(*) Notice: Subject to any disclaimer, the term of this patent is extended or adjusted under 35 U.S.C. 154(b) by 0 days.

(21) Appl. No.: 11/021,579

(22) Filed: Dec. 23, 2004

(65) Prior Publication Data

US 2005/0104629 A1 May 19, 2005

Related U.S. Application Data

(62) Division of application No. 10/357,166, filed on Jan. 31, 2003, now Pat. No. 6,864,748.

(51) Int. Cl.[7] .............................................. H03F 3/04
(52) U.S. Cl. ...................................... 330/288; 330/296
(58) Field of Search ................................ 330/288, 277, 330/296; 323/315, 316

(56) References Cited

U.S. PATENT DOCUMENTS

| 3,939,434 A | * | 2/1976 | Crosby ........................ 330/288 |
| 5,359,296 A | * | 10/1994 | Brooks et al. ............... 330/288 |
| 6,492,874 B1 | * | 12/2002 | Shih ........................... 330/288 |

* cited by examiner

Primary Examiner—Henry Choe
(74) Attorney, Agent, or Firm—Cochran, Freund & Young LLC

(57) ABSTRACT

An amplifier for a differential signal drain is able to amplify a signal over a frequency range and boost the signal within a specified frequency range. A resistor is placed between the drain and gate of the first transistor of a cascode amplifier and can be selected to provide additional signal boost at a specified input frequency. An additional input transistor may be added to provide a stepped amplification over the frequency range. The amplifier is further able to reject common mode signals by using regulating transistors.

11 Claims, 5 Drawing Sheets

DIFFERENTIAL CURRENT AMPLIFIER WITH COMMON MODE REJECTION AND HIGH FREQUENCY BOOST

CROSS REFERENCE TO RELATED APPLICATIONS

This application is a divisional patent application and claims the benefit of U.S. Nonprovisional patent application Ser. No. 10/357,166 for "Differential Current Amplifier With Common Mode Rejection And High Frequency Boost," which was filed on Jan. 31, 2003 now U.S. Pat. No. 6,864,748, by Kenneth G. Richardson.

BACKGROUND OF THE INVENTION

1. Field of the Invention

The present invention pertains to electronic amplifier circuits and specifically to integrated circuit amplifier circuits.

2. Description of the Background

Amplifier circuits are used in may applications in integrated circuits. One common amplifier circuit is a cascode current mirror that is commonly used in integrated circuits. In general, the current mirrors are designed to generate a flat output. That is, the gain is constant throughout the operating range. In some applications, there is need to increase the output in a selective portion of the frequency range.

Differential currents between two signal lines are sometimes used as signals in an integrated circuit. Amplification of differential currents is accomplished by increasing the currents on the signal lines. In addition, it is desirable to decrease the common voltage mode between the two signal lines.

It would therefore be advantageous to provide an amplifier circuit wherein a differential signal may be amplified over a certain frequency wherein a specific range may have a boost. It would be further advantageous if the amplifier was able to reject common mode signals.

SUMMARY OF THE INVENTION

The present invention overcomes the disadvantages and limitations of the prior art by providing a system and method for amplifying a differential signal on an integrated circuit with a high frequency boost. This can be accomplished by placing a resistor between the input line and the gate of a first transistor of a cascade amplifier. Such an amplifier may be used in parallel to amplify the two signals of a differential input and may have circuitry to capture the common mode portion of the signal and adjust the output so that the common mode portion of the signal is subtracted from the outputs. The resistors in the first transistor may be selected to give a signal boost in a specific range of input frequencies.

The present invention may therefore comprise a current amplifier with high frequency boost comprising: an input line; an output line; a first set of transistors connected in parallel having the drains connected to the input line and the sources connected to ground, the first set of transistors comprising at least one transistor; a resistor connected to the input line and the gates of the first set of transistors; and a set of output transistors connected in parallel having the gates connected to the input line, the sources connected to ground, and the drains connected to the output line, the second set of transistors comprising at least one transistor.

The present invention may further comprise a current amplifier with high frequency boost comprising: an input line; an output line; a first set of input transistors connected in parallel having the drains connected to the input line and the sources connected to ground, the first set of input transistors comprising at least one transistor; a resistor connected to the input line and the gates of the first set of input transistors; and a first set of output transistors connected in parallel having the gates connected to the input line, the sources connected to ground, and the drains connected to the output line, the first set of output transistors comprising at least one transistor.

The present invention may further comprise a differential current amplifier with high frequency boost comprising: a first input line; a second input line; a first output line; a second output line; a first set of input transistors connected in parallel having the drains connected to the first input line and the sources connected to ground, the first set of input transistors comprising at least one transistor; a first resistor connected to the first input line and the gates of the first set of input transistors; a first set of output transistors connected in parallel having the gates connected to the first input line, the sources connected to ground, and the drains connected to the first output line, the first set of output transistors comprising at least one transistor; a second set of input transistors connected in parallel having the drains connected to the second input line and the sources connected to ground, the second set of input transistors comprising the same number of transistors as the first set of input transistors; a second resistor connected to the second input line and the gates of the second set of input transistors, the second resistor having substantially the same resistance as the first resistor; and a second set of output transistors connected in parallel having the gates connected to the second input line, the sources connected to ground, and the drains connected to the second output line, the second set of output transistors comprising the same number of transistors as the first set of output transistors.

The present invention may further comprise a differential current amplifier with high frequency boost and common mode suppression comprising: a first input line; a second input line; a first output line; a second output line; a first set of regulating transistors connected in parallel having the sources connected to ground and the gates connected to a first voltage drain; a second set of regulating transistors connected in parallel having the sources connected to ground and the gates connected to a second voltage drain; a first set of input transistors connected in parallel having the drains connected to the first input line and the sources connected to the drains of the first set of regulating transistors, the first set of input transistors comprising at least one transistor; a first resistor connected to the first input line and the gates of the first set of input transistors; a first set of output transistors connected in parallel having the gates connected to the first input line, the sources connected to the drains of the second set of regulating transistors, and the drains connected to the first output line, the first set of output transistors comprising at least one transistor; a second set of input transistors connected in parallel having the drains connected to the second input line and the sources connected to the drains of the first regulating transistor, the second set of input transistors comprising the same number of transistors as the first set of input transistors; a second resistor connected to the second input line and the gates of the second set of input transistors the second resistor having substantially the same resistance as the first resistor; a second set of output transistors connected in parallel having the gates connected to the second input line, the sources connected to the drains of the second set of regulating transistors, and the drains connected to the second output line, the second set of output transistors comprising the same number of transistors as the first set of output transistors.

The advantages of the present invention are that differential signals may be amplified with a boost in a specific frequency range. The circuitry required is simple and therefore takes up a small portion of space on an integrated circuit. The signal boost may be tuned to a specific frequency range depending on the resistor value chosen. Further, the integrated common mode rejection increases the signal to direct current ratio substantially.

DETAILED DESCRIPTION OF THE INVENTION

Figure 1:
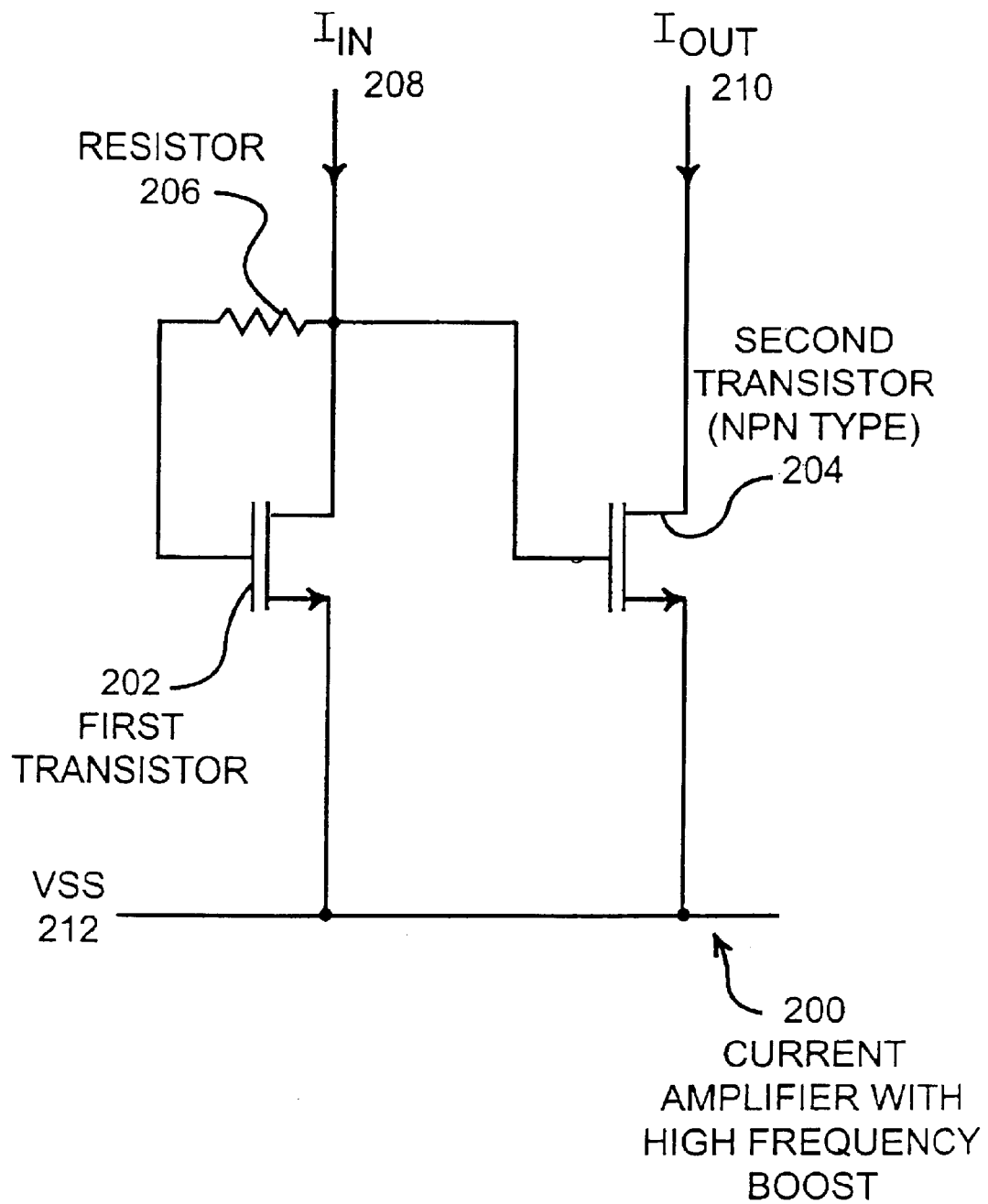
FIG. 1 is an illustration of an embodiment of the present invention of a current mirror with high frequency boost.

FIG. 1 illustrates an embodiment of the present invention of a current mirror with high frequency boost, comprised of a first transistor 202, a second transistor 204, and a resistor 206. The input line 208 is connected to the drain of the first transistor 202, one end of the resistor 206, and the gate of transistor 204. The other end of the resistor 206 is connected to the gate of transistor 202. The drain of transistor 204 is connected to the output line 210. The sources of transistors 202 and 204 are connected to ground 212.

The embodiment 200 behaves as a normal current mirror under low frequencies. However, at high frequencies, the resistor 206 couples with the gate capacitance of transistor 202 to drive more current into the gate of transistor 204, causing a higher output current on output line 210. The resistance of resistor 206 may be tuned to provide desired levels of amplification. Such amplification may be necessary to compensate for the performance of other components attached to the circuitry to enable an entire system to perform at a higher frequency than would otherwise be possible.

In integrated circuits, the transistors 202 and 404 may be implemented as many identical transistors operating in parallel. Amplification of the current signal may be achieved by varying the number of individual transistors represented by transistors 202 and 204. For example, an embodiment may be implemented in an integrated circuit by using ten individual transistors in parallel to act as transistor 202 and twenty individual transistors in parallel to act as transistor 204. The ratio of ten transistors to twenty transistors results in a 2:1 amplification of the current signal. It is common to use different numbers of transistors to achieve different degrees of amplification.

Figure 2:
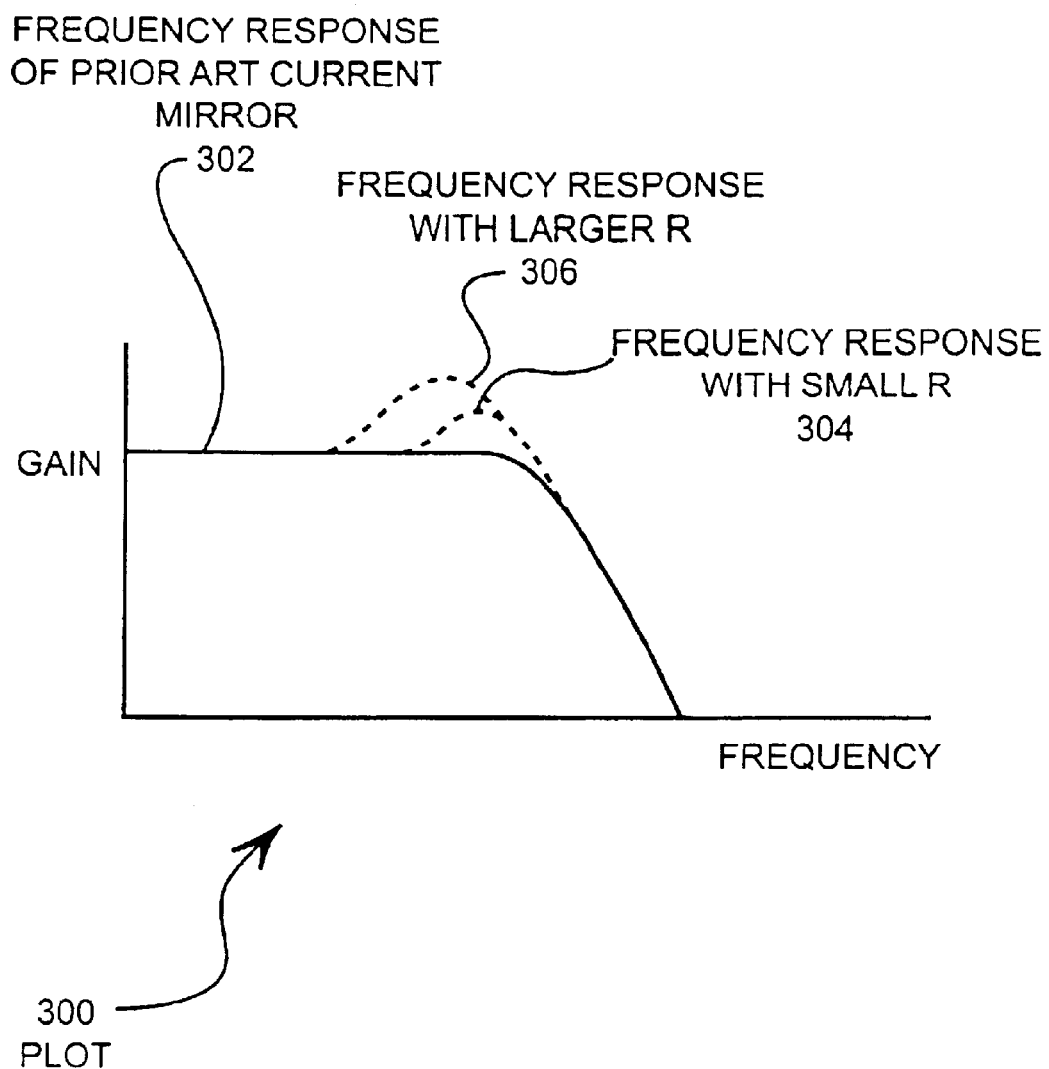
FIG. 2 is an illustration of a plot of the gain with respect to frequency of the present invention.

FIG. 2 illustrates a plot 300 of the gain 301 with respect to frequency 303. The curve 302 represents the frequency response of a prior art current mirror. The curve 304 represents a frequency response of an embodiment of the present invention wherein a small resistance is present. The curve 306 represents a frequency response of an embodiment of the present invention with a higher resistance. The frequency response of the amplifier may be adjusted by varying the resistance.

Figure 3:
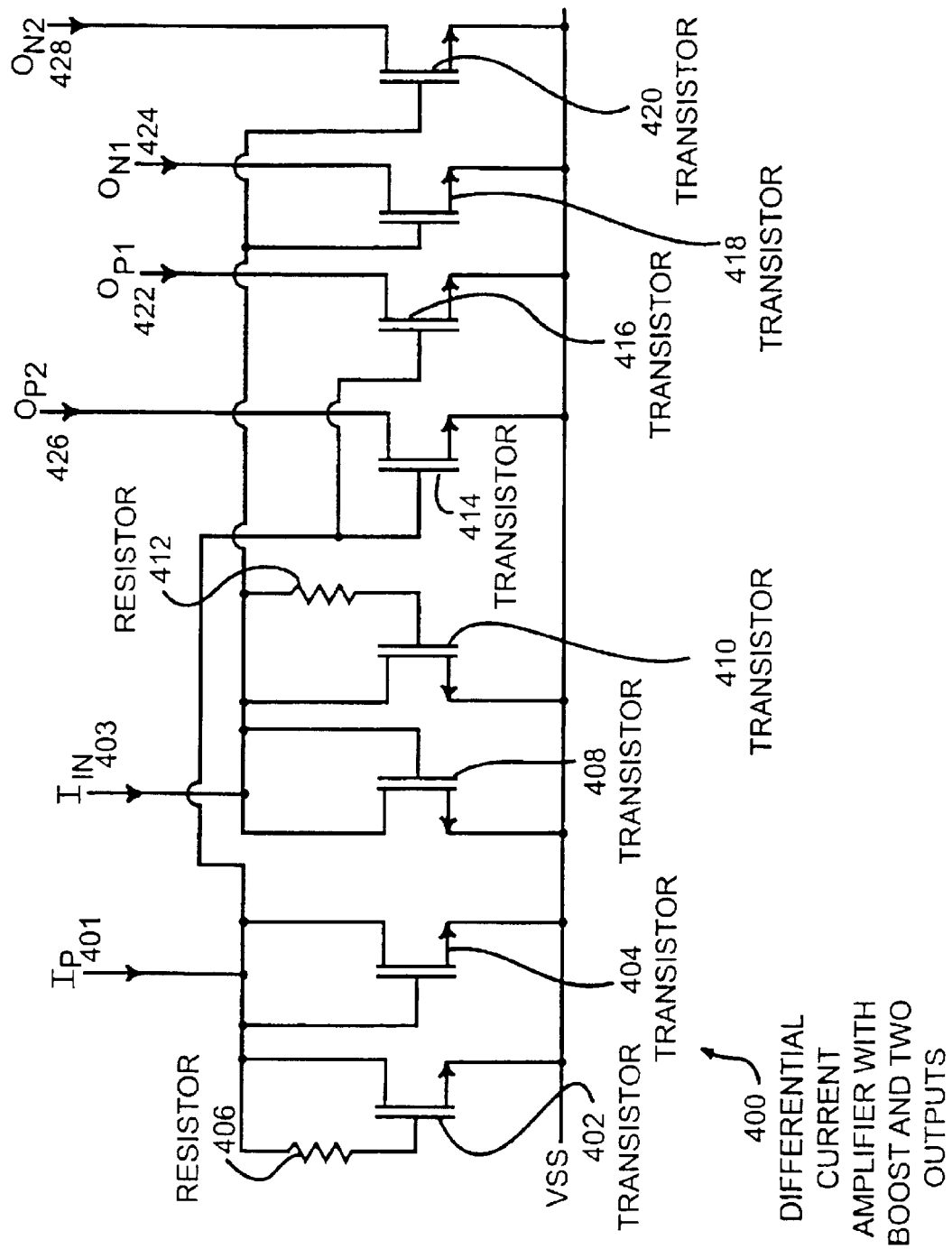
FIG. 3 is an illustration of an embodiment of the present invention of a differential amplifier with high frequency boost and two outputs.

FIG. 3 illustrates an embodiment 400 of the present invention of a differential amplifier with high frequency boost and two outputs. The amplifier comprises transistors 402 and 404 and resistor 406 that provide the first stage of one channel, and transistors 408 and 410 and resistor 412 that provide the first stage of the second channel. Two output transistors 414 and 416 provide the first signal of each of the outputs while output transistors 418 and 420 provide the second signal for each of the output pairs. Transistors 416 and 418 provide the signals for output pair 422 and 424 as transistors 414 and 420 provide signals for output pair 426 and 428.

The embodiment 400 has two output pairs. The gates of transistors 414 and 416 are driven in parallel. The difference in size between the transistors 414 and 416 may provide different amplification to the resulting signals such that one has more current than another. In an integrated circuit embodiment, the various transistors may comprise multiple individual transistors operating in parallel. In such an embodiment, the output current may be divided between the two outputs in proportion to the ratio of the number of individual transistors represented by the various transistors.

The embodiment 400 operates in a similar manner as the embodiment 200 described above. At low frequencies, the amplifier operates as a conventional current mirror. As the frequency increases, the resistors 406 and 412 couple with the gate capacitance of transistors 402 and 410, respectively, to direct more current to the output transistors. In effect, the transistors 402 and 410 are effectively taken out of the circuit at those frequencies, changing the amplifier to a current mirror comprising only transistors 404 and 408 as the first transistors of the current mirror.

Figure 4:
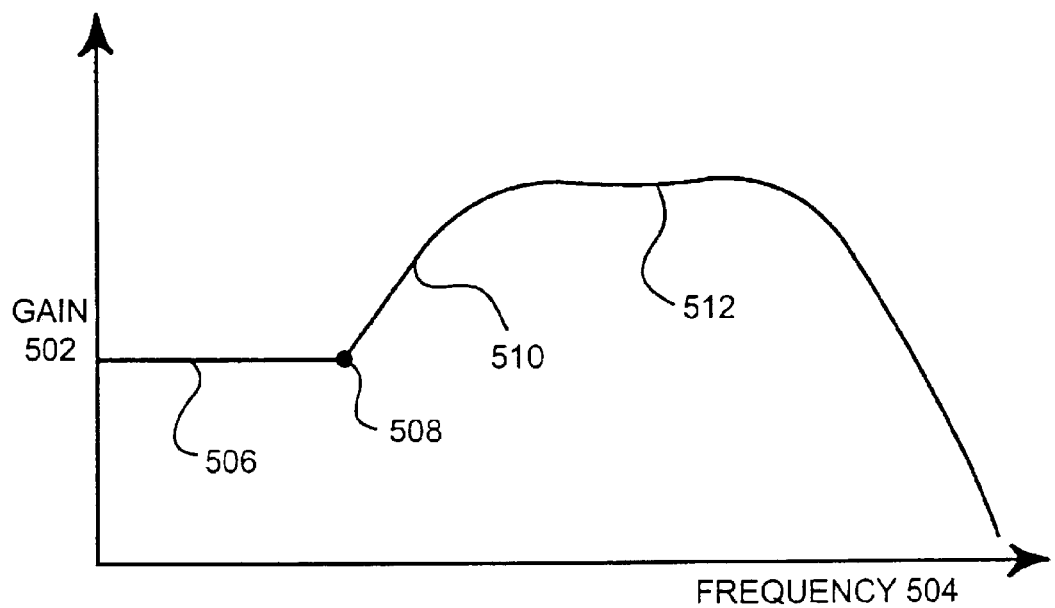
FIG. 4 is an illustration of a plot of the frequency response of the embodiment of FIG. 3.
Figure 4:
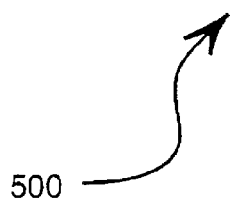

FIG. 4 illustrates a Bode plot 500 of the frequency response of embodiment 400. The gain 502 is shown with respect to frequency 504. For the purposes of explaining the figure, transistor 402 will be referred to as transistor 1, having a width $W_1$, length $L_1$, and multiple number $M_1$. Similarly, transistor 404 will have width $W_2$, length $L_2$, and multiple number $M_2$. The transistors 414 and 416 will be combined into a single transistor with width $W_3$, length $L_3$, and multiple number $M_3$.

The lower frequency portion 506 of the curve will generally have a gain defined by:

$$gain = \frac{\left(\frac{W_3}{L_3}\right) \times M_3}{\left(\frac{W_1}{L_1}\right) \times M_1 + \left(\frac{W_2}{L_2}\right) \times M_2}$$

The transition point 508 can be approximated by the equation:

$$\omega = \frac{1}{RC_{g1}}$$

where R is the resistance of the resistor 406 and $C_{g1}$ is the gate capacitance of the transistor 402.

The slope of the curve in the area 510 can be approximated by the equation:

$$slope \propto \omega$$

The high frequency portion 512 of the curve will generally have a gain defined by:

$$gain = \frac{\left(\frac{W_3}{L_3}\right) \times M_3}{\left(\frac{W_2}{L_2}\right) \times M_2}$$

Those skilled in the arts will appreciate that the equations may be used to solve for the appropriate gains and transition points as necessary.

Figure 5:
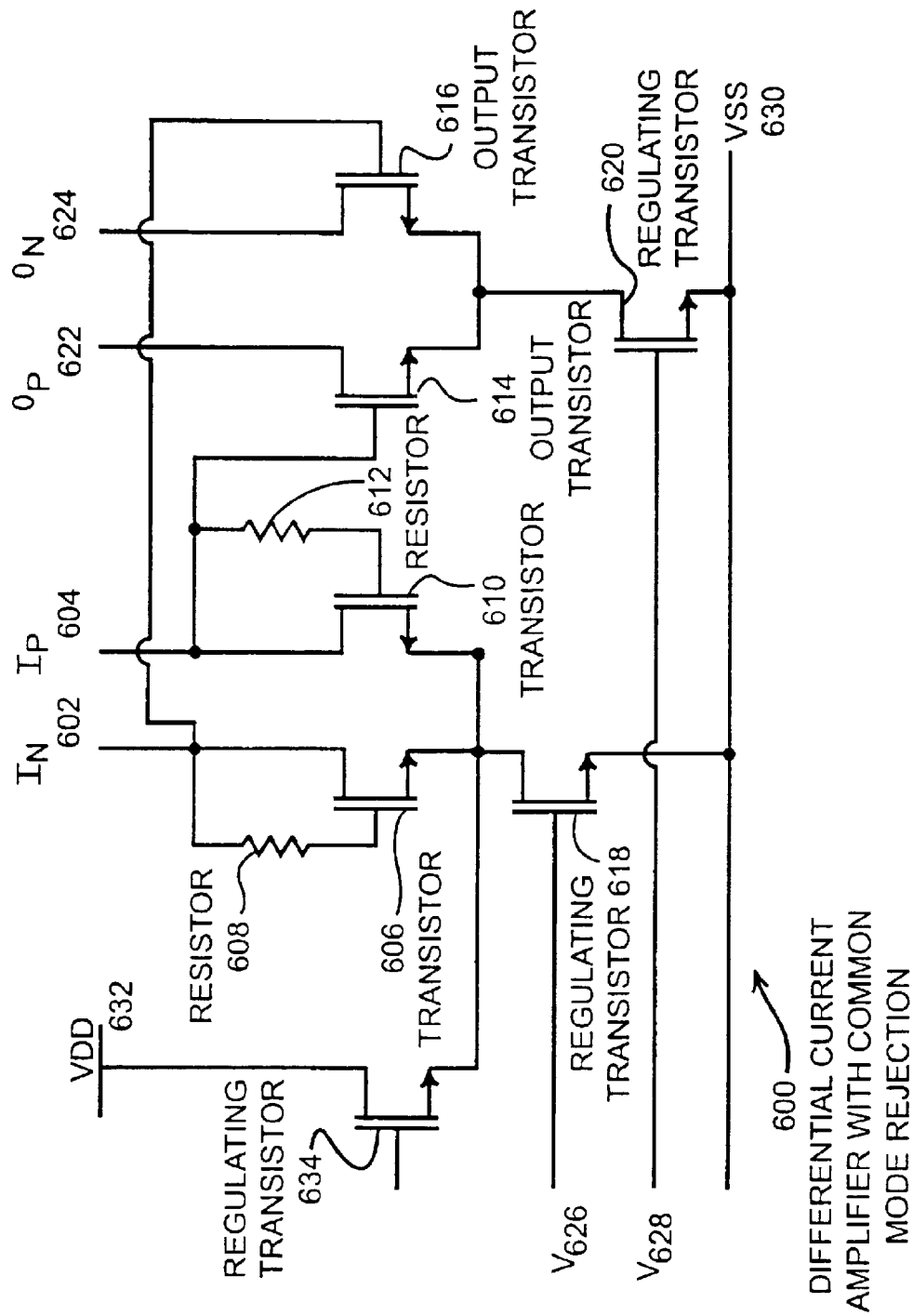
FIG. 5 is an illustration of an embodiment of the present invention of a differential current amplifier with high frequency boost and common mode rejection.

FIG. 5 illustrates an embodiment 600 of the present invention of a differential current amplifier with high frequency boost and common mode rejection. The input line 602 is connected to transistor 606 through the drain. A resistor 608 is connected from the input line 602 to the gate of transistor 606. The source of transistor 606 is connected to the drain of regulating transistor 618. Similarly, input line 604 is connected to transistor 610 through the drain. A resistor 612 is connected from the input line 604 to the gate of transistor 610. The source of transistor 610 is connected to the drain of regulating transistor 618. The gate of transistor 616 is connected to the input 602 as is the gate of transistor 614 is connected to the input 604. The output lines 622 and 624 are connected to the drains of transistors 614 and 616, respectively. The sources of transistors 614 and 616 are connected to the drain of regulating transistor 620. The sources of regulating transistors 618 and 620 are connected to ground 630. A second regulating transistor 634 is connected to a high voltage drain VDD 632 through the drain, a constant voltage drain 636 through the gate, and the source of transistor 606 through its source.

The constant voltages 626, 628, and 634 allow the regulating transistors 618, 620, and 634 to operate as constant current drains. In this manner, a rise or fall in the combined current of inputs 602 and 604 are negated and the output signals 622 and 624 have a combined current that is set by the regulating transistor 620.

The result of the embodiment 600 is that the differential current signals on lines 602 and 604 may be amplified onto output lines 622 and 624 while having a constant output current in common mode. Transient changes in common mode current signals can thereby be eliminated. The embodiment may be used to shift the common mode current to a more desirable output level.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A differential current amplifier with high frequency boost comprising:
   a first input line;
   a second input line;
   a first output line;
   a second output line;
   a first set of input transistors connected in parallel having the drains connected to said first input line and the sources connected to ground, said first set of input transistors comprising at least one transistor;
   a first resistor connected to said first input line and the gates of said first set of input transistors;
   a first set of output transistors connected in parallel having the gates connected to said first input line, the sources connected to ground, and the drains connected to said first output line, said first set of output transistors comprising at least one transistor;
   a second set of input transistors connected in parallel having the drains connected to said second input line and the sources connected to ground, said second set of input transistors comprising the same number of transistors as said first set of input transistors;
   a second resistor connected to said second input line and the gates of said second set of input transistors, said second resistor having substantially the same resistance as said first resistor; and
   a second set of output transistors connected in parallel having the gates connected to said second input line, the sources connected to ground, and the drains connected to said second output line, said second set of output transistors comprising the same number of transistors as said first set of output transistors.

2. The differential current amplifier of claim 1 wherein said first set of input transistors and said first set of output transistors are NPN-type transistors.

3. The differential current amplifier of claim 1 wherein said amplifier is at least a portion of an integrated circuit.

4. The differential current amplifier of claim 1 wherein said first set of output transistors comprises a different number of transistors than said first set of input transistors.

5. The differential current amplifier of claim 1 further comprising:
   a third set of input transistors connected in parallel having the drains connected to said first input line, the gates connected to said first input line, and the sources connected to ground, said third set of input transistors comprising at least one transistor; and
   a fourth set of input transistors connected in parallel having the drains connected to said second input line, the gates connected to said second input line, and the sources connected to ground, said fourth set of input transistors comprising the same number of transistors as said third set of input transistors.

6. A differential current amplifier with high frequency boost and common mode suppression comprising:
   a first input line;
   a second input line;
   a first output line;
   a second output line;
   a first set of regulating transistors connected in parallel having the sources connected to ground and the gates connected to a first voltage drain;
   a second set of regulating transistors connected in parallel having the sources connected to ground and the gates connected to a second voltage drain;
   a first set of input transistors connected in parallel having the drains connected to said first input line and the sources connected to the drains of said first set of regulating transistors, said first set of input transistors comprising at least one transistor;
   a first resistor connected to said first input line and the gates of said first set of input transistors;

a first set of output transistors connected in parallel having the gates connected to said first input line, the sources connected to the drains of said second set of regulating transistors, and the drains connected to said first output line, said first set of output transistors comprising at least one transistor.

a second set of input transistors connected in parallel having the drains connected to said second input line and the sources connected to said drains of said first set of regulating transistors, said second set of input transistors comprising the same number of transistors as said first set of input transistors;

a second resistor connected to said second input line and the gates of said second set of input transistors said second resistor having substantially the same resistance as said first resistor;

a second set of output transistors connected in parallel having the gates connected to said second input line, the sources connected to said drains of said second set of regulating transistors, and the drains connected to said second output line, said second set of output transistors comprising the same number of transistors as said first set of output transistors.

7. The differential current amplifier of claim 6 wherein said first set of input transistors and said first set of output transistors are NPN-type transistors.

8. The differential current amplifier of claim 6 wherein said amplifier is at least a portion of an integrated circuit.

9. The differential current amplifier of claim 6 wherein said first set of output transistors comprises a different number of transistors than said first set of input transistors.

10. The differential current amplifier of claim 6 further comprising:

a third set of regulating transistors connected in parallel having the sources connected to said sources of said first set of input transistors and the gates connected to a third voltage drain.

11. The differential current amplifier of claim 6 further comprising:

a third set of input transistors connected in parallel having the drains connected to said first input line, the gates connected to said first input line, and the sources connected to said drains of said first set of regulating transistors, said third set of input transistors comprising at least one transistor; and a fourth set of input transistors connected in parallel having the drains connected to said second input line, the gates connected to said second input line, and the sources connected to said drains of said first set of regulating transistors, said fourth set of input transistors comprising the same number of transistors as said third set of input transistors.

* * * * *